(12) United States Patent
Downing (10) Patent No.: US 10,756,228 B2
(45) Date of Patent: Aug. 25, 2020

(54) OPTICAL SENSOR AND METHOD OF MANUFACTURE

(71) Applicant: STMICROELECTRONICS (RESEARCH & DEVELOPMENT) LIMITED, Marlow, Buckinghamshire (GB)

(72) Inventor: James Peter Drummond Downing, Doune (GB)

(73) Assignee: STMICROELECTRONICS (RESEARCH & DEVELOPMENT) LIMITED, Marlow (GB)

(*) Notice: Subject to any disclaimer, the term of this patent is extended or adjusted under 35 U.S.C. 154(b) by 0 days.

(21) Appl. No.: 15/967,242

(22) Filed: Apr. 30, 2018

(65) Prior Publication Data

US 2019/0334052 A1    Oct. 31, 2019

(51) Int. Cl.
| | | |
|---|---|---|
| H01L 31/16 | (2006.01) | |
| H01L 27/144 | (2006.01) | |
| H01L 31/107 | (2006.01) | |
| H01L 31/0232 | (2014.01) | |
| G01S 7/481 | (2006.01) | |

(52) U.S. Cl.
CPC ........ *H01L 31/165* (2013.01); *H01L 27/1443* (2013.01); *H01L 27/1446* (2013.01); *H01L 31/02327* (2013.01); *H01L 31/107* (2013.01); *G01S 7/4816* (2013.01)

(58) Field of Classification Search
CPC ....... H01L 27/14649–14652; H01L 27/14627; G01S 7/48–4818
See application file for complete search history.

(56) References Cited

U.S. PATENT DOCUMENTS

| | | | |
|---|---|---|---|
| 8,975,607 B2 | 3/2015 | Renna et al. | |
| 9,383,434 B2 * | 7/2016 | Bouchilloux | G01S 17/46 |
| 2002/0163054 A1 * | 11/2002 | Suda | H01L 27/14618 257/431 |
| 2008/0174670 A1 * | 7/2008 | Olsen | H01L 27/14645 348/222.1 |
| 2012/0026093 A1 * | 2/2012 | Duparre | G06F 3/03547 345/166 |
| 2012/0132788 A1 * | 5/2012 | Findlay | G01J 1/0219 250/208.2 |
| 2015/0281601 A1 * | 10/2015 | Ganapathi | H04N 5/332 348/164 |
| 2015/0372185 A1 * | 12/2015 | Rossi | H01L 31/1876 438/27 |
| 2017/0186886 A1 * | 6/2017 | Weng | G01J 1/4204 |
| 2017/0314989 A1 | 11/2017 | Mazzillo et al. | |

* cited by examiner

*Primary Examiner* — Stephen M Bradley
(74) *Attorney, Agent, or Firm* — Seed Intellectual Property Law Group LLP (57) ABSTRACT

The present disclosure relates to a sensor comprising: an array of photodetectors comprising a first subarray of at least one photodetector and a second subarray of at least one photodetector; a first optical arrangement to direct incoming photons toward the first subarray; and a second optical arrangement to direct incoming photons toward the second subarray.

19 Claims, 6 Drawing Sheets

OPTICAL SENSOR AND METHOD OF MANUFACTURE

BACKGROUND

Technical Field

The invention relates to a sensor and a method of manufacturing a sensor.

Description of the Related Art

Some apparatuses (e.g. mobile phones, tablet computers, laptop computers, desktop computers, video game consoles, smart card readers, video cameras, televisions, vehicles etc.) are equipped with proximity sensors for detecting the presence of an object, measuring the distance to an object or generating a depth map of an object.

A proximity sensor typically comprises a photoemitter for emitting photons (e.g. infrared photons) toward an object, an array of photodetectors (e.g., single photon avalanche diodes) for detecting photons reflected by the object and a processing unit for measuring a time of flight of the photons.

A diverging optical element is often placed in the optical path of the photoemitter to direct the infrared photons toward the object. Likewise, a converging optical element such as an imaging lens is often placed in the optical path of the array of photodetectors to direct the infrared photons reflected by the object toward the array of photodetectors.

BRIEF SUMMARY

According to one aspect, there is provided a sensor comprising: an array of photodetectors comprising a first subarray of at least one photodetector and a second subarray of at least one photodetector; a first optical arrangement to direct incoming photons toward the first subarray; and a second optical arrangement to direct incoming photons toward the second subarray.

The sensor may comprise a package with a front face and wherein the first optical arrangement comprises a first aperture within the front face and the second optical arrangement comprises a second aperture within the front face.

The first optical arrangement may comprise a first converging optical element and the second optical arrangement comprises a second converging optical element.

The first subarray and the first converging optical element may be aligned along an optical axis of the first converging optical element and wherein the second subarray and the second converging optical element are aligned along an optical axis of the second converging optical element.

The optical axis of the first converging optical element may be parallel to the optical axis of the second converging optical element.

The first subarray and the second subarray may be coplanar.

The first subarray and the second subarray may be arranged on a same substrate.

The first subarray, the first converging optical element and the first aperture may be aligned along an optical axis of the first converging optical element and wherein the second subarray, the second converging optical element and the second aperture are aligned along an optical axis of the second converging optical element.

The sensor may comprise: a photoemitter to emit outgoing photons; and a diverging optical element to direct outgoing photons toward an object.

An optical axis of the diverging optical element may be parallel to an optical axis of the first converging optical element and an optical axis of the second converging optical element.

The sensor may comprise: a package comprising a front face; a third aperture within the front face to allow the outgoing photons through.

The third aperture, the diverging optical element and the photoemitter may be aligned along an optical axis of the diverging optical element.

The sensor may be a proximity sensor.

The at least one photodetector may comprise a single photon avalanche diode (SPAD).

The incoming photons may comprise infrared photons.

The sensor may be integrated on a single packaged module.

According to another aspect there is provided an apparatus comprising any of the above sensors.

The apparatus may comprise a mobile phone, a tablet computer, a laptop computer, a video game console, a smart card reader, a video camera, a television or a vehicle.

According to another aspect there is provided a method of manufacturing a sensor comprising: providing an array of photodetectors comprising a first subarray of at least one photodetector and a second subarray of at least one photodetector; providing a first optical arrangement to direct incoming photons toward the first subarray; and providing a second optical arrangement to direct incoming photons toward the second subarray.

BRIEF DESCRIPTION OF THE SEVERAL VIEWS OF THE DRAWINGS

Reference will now be made, by way of example only, to the accompanying drawings in which.

DETAILED DESCRIPTION

As discussed above, conventional proximity sensors typically comprise a photoemitter for emitting photons (e.g. infrared photons) toward an object, an array of photodetectors (e.g., single photon avalanche diodes) for detecting photons reflected by the object and a processing unit for measuring a time of flight of the photons.

A diverging optical element is often placed in the optical path of the photoemitter to direct the infrared photons toward the object. Likewise, a converging optical element such as an imaging lens is often placed in the optical path of the array of photodetectors to direct the photons reflected by the object toward the array of photodetectors.

An issue with conventional proximity sensors is the need to compromise between form factor (e.g. thickness) and performance.

Figure 1:
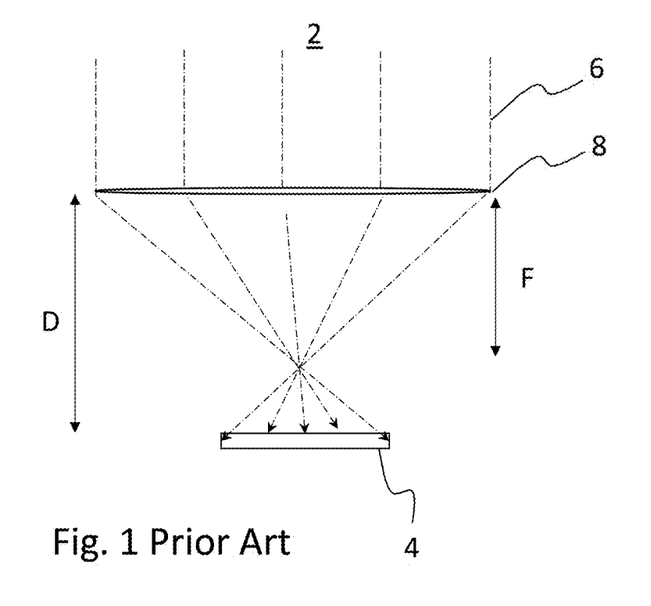
FIG. 1 show a schematic view of an example of a conventional proximity sensor.

FIG. 1 shows a schematic view of a conventional proximity sensor 2. The proximity sensor 2 provides a high performance but a thick form factor. The proximity sensor 2 comprises an array of photodetectors 4 for detecting photons 6 reflected by an object. The proximity sensor 2 comprises a converging optical element such as an imaging lens 8 placed in the optical path of the array of photodetectors 4 to direct the photons 6 toward the array of photodetectors 4.

The proximity sensor 2 uses a large converging optical element 8 to direct a large amount of photons 6 toward the array of photodetectors 4 and improve the photons detection probability.

An issue with the proximity sensor 2 is that for a given F-number, the larger the converging optical element 8, the longer its focal length F and therefore the longer the distance D between the array of photodetectors 4 and the converging optical element 8 and the thicker the proximity sensor 2.

Figure 2:
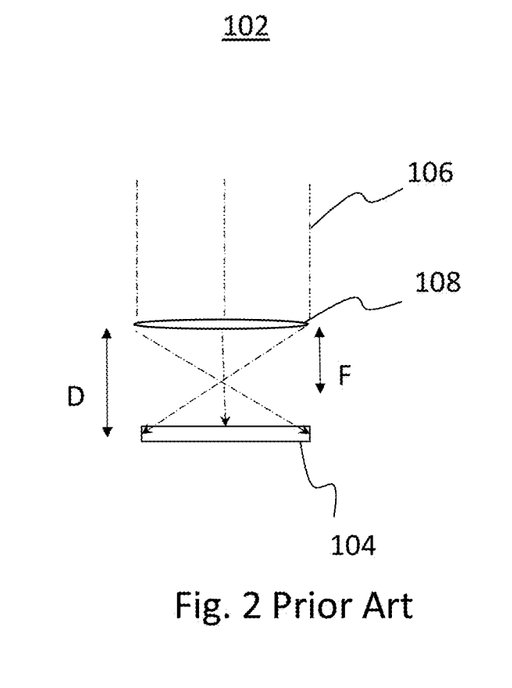
FIG. 2 shows a schematic view of another example of a conventional proximity sensor.

FIG. 2 shows a schematic view of a conventional proximity sensor 102. The proximity sensor provides a thin form factor but low performance. The proximity sensor 102 comprises an array of photodetectors 104 for detecting photons 106 reflected by an object. The proximity sensor 102 comprises a converging optical element such as an imaging lens 108 placed in the optical path of the array of photodetectors 104 to direct the photons 106 toward the array of photodetectors 104.

The proximity sensor 102 uses a small converging optical element with a small focal length F. As a result, the distance D between the array of photodetectors 104 and the converging optical element 108 and the form factor of the proximity sensor 104 can be thinner.

An issue with the proximity sensor 2 is that the smaller the converging optical element 108 the smaller the amount of photons 106 directed toward the array of photodetectors 104 and therefore the lower the photons detection probability.

An objective of the present disclosure is to provide a high performance and thin form factor proximity sensor.

Figure 3:
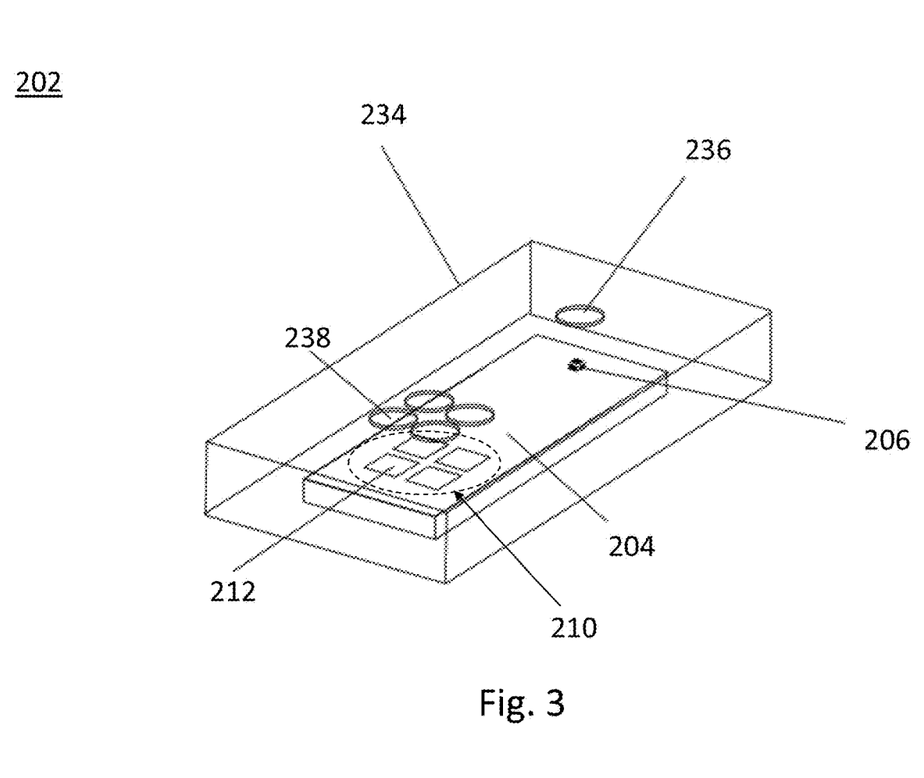
FIG. 3 shows a perspective view of an example of a proximity sensor according to an embodiment disclosed herein.
Figure 4:
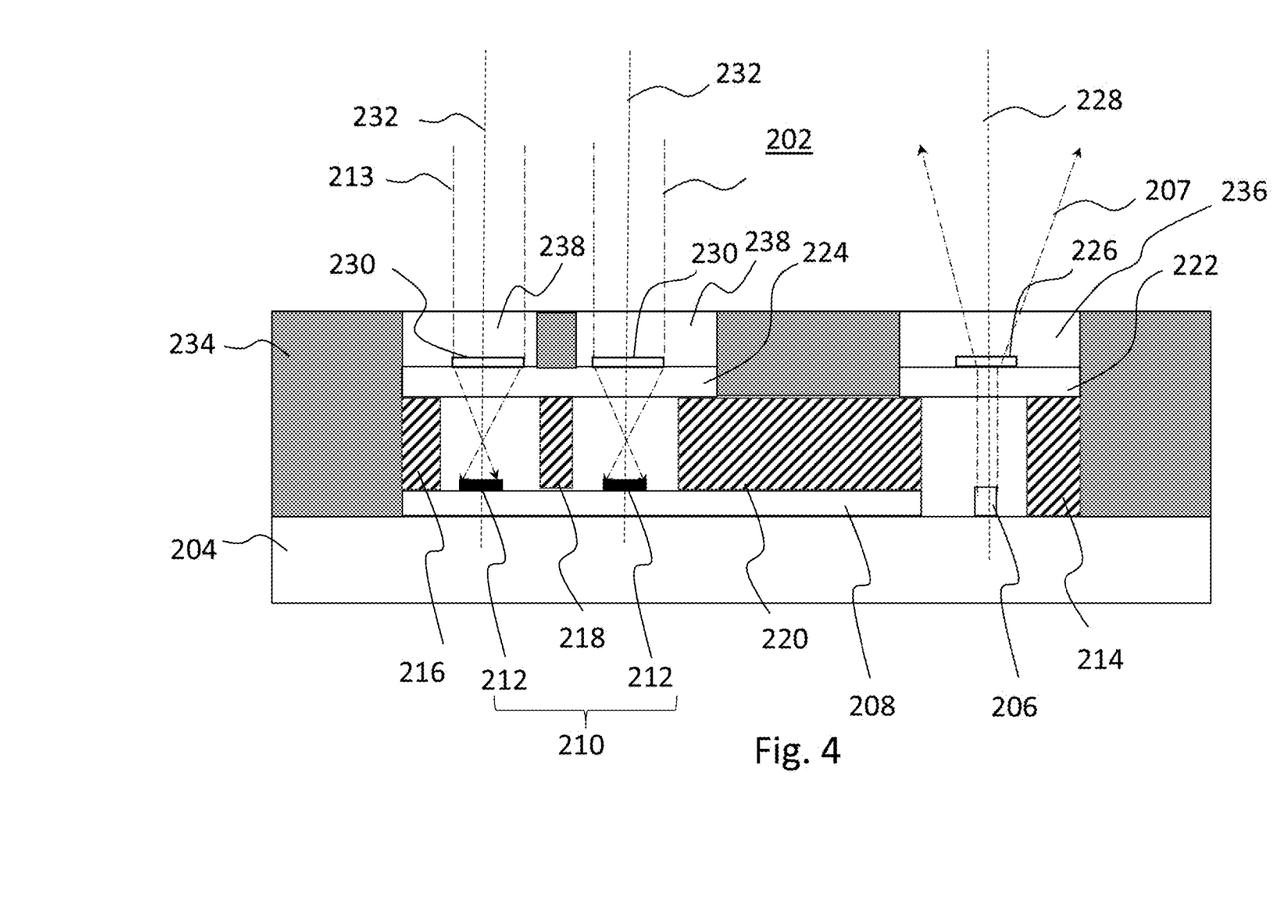
FIG. 4 shows a cross sectional view of an example of a proximity sensor according to an embodiment disclosed herein.
Figure 5:
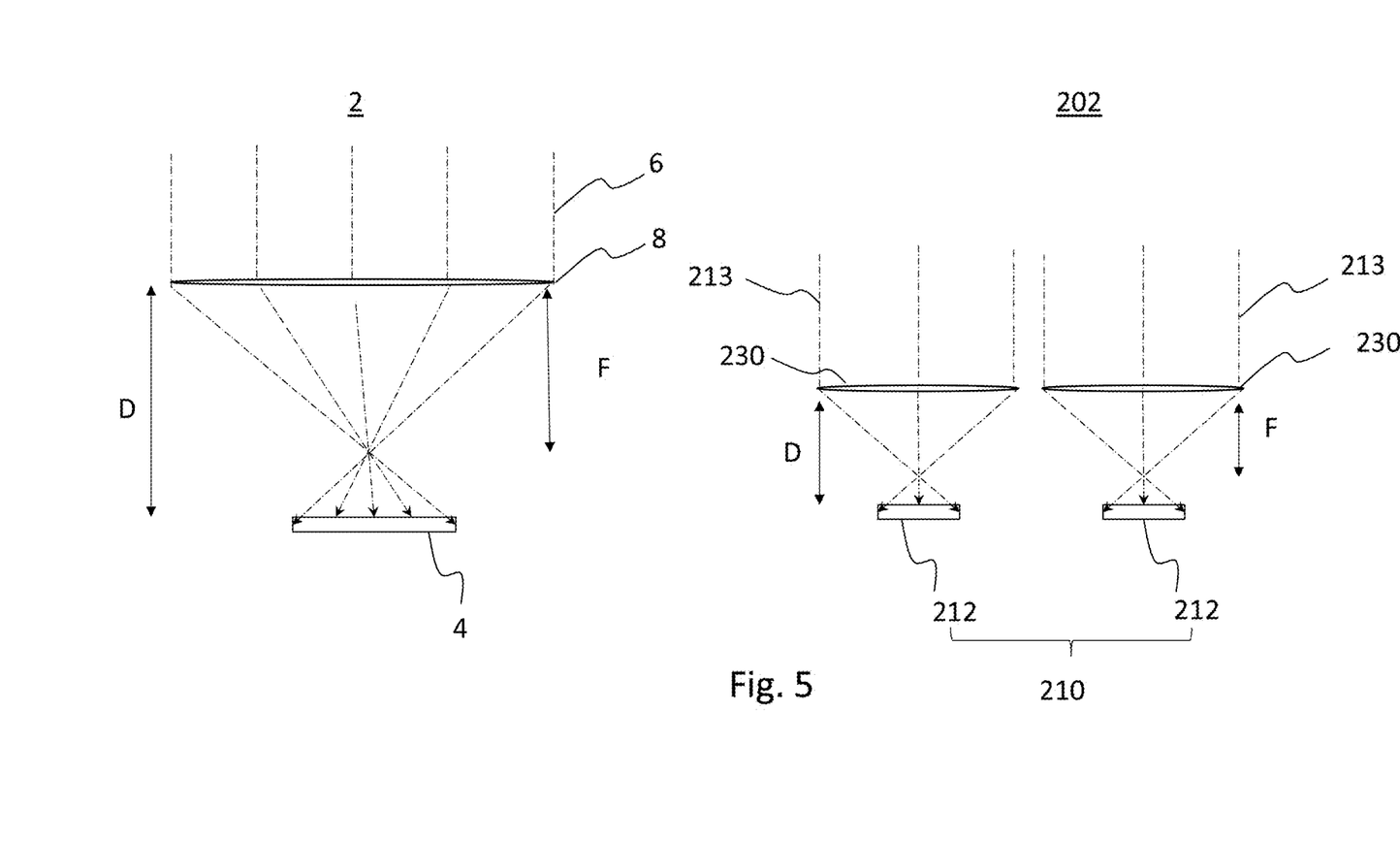
FIG. 5 shows a schematic view of an example of a proximity sensor according to an embodiment disclosed herein.

FIGS. 3 to 5 show an example of a proximity sensor 202 according to some embodiments. The proximity sensor 202 comprises a substrate 204. For example, the substrate 204 is made of silicon.

The proximity sensor 202 comprises a photoemitter 206 arranged on the substrate 204. Here, the photoemitter 206 is configured to generate outgoing infrared photons 207 (e.g. photons with a wavelength between 700 nm and 900 nm). However, it will be understood that in other embodiments the photoemitter 206 may be configured to generate other wavelengths.

The proximity sensor 202 comprises a die 208 (shown on FIG. 4) arranged on the substrate 204. For example, the die 208 is also made of silicon.

The proximity sensor 202 comprises an array 210 of photodetectors for detecting incoming infrared photons 213 reflected by an object. The array 210 of photodetectors rest on the die 208.

Each photodetector may comprise a single photon avalanche diode (SPAD). A conventional SPAD comprises a PN junction including a P region (i.e. a region doped with a P dopant) and an N region (i.e. a region doped with an N dopant). The PN junction comprises a depletion region (also known as depletion layer or depletion zone) that is naturally formed at the interface of the P region and the N region. An anode connects the P region to a negative terminal of a voltage supply. A cathode connects the N region to a positive terminal of the voltage supply. In this way, the PN junction is polarised with a reverse biased voltage exceeding a breakdown voltage.

When an infrared photon with sufficient energy is absorbed, a bound electron is freed in the depletion region, accelerated, collides with atoms and free further bound electrons. Some of these electrons recombine with holes. Others are accelerated, collide with atoms and free further bound electrons, and so on. That is, each infrared photon absorbed by the SPAD generates a pulse.

A SPAD may be associated with a readout unit. The readout unit may be configured to selectively detect a pulse generated by the absorption of an infrared photon. The readout unit may be configured to determine a time-of-flight of the infrared photon assuming that the infrared photon was generated by the photoemitter 206 and reflected by an object. The readout unit may be configured to determine a distance between the SPAD and the object and generating a value indicative of that distance.

A SPAD may also be associated with a control unit. The control unit may be configured to selectively quench and resetting the SPAD after generating a pulse. Quenching refers to the process by which a component (e.g. active or passive) brings the reverse bias voltage between the anode and the cathode below the breakdown voltage following the triggering of an avalanche. Resetting refers to the process by which a component (e.g. active or passive) brings the reverse bias voltage back above the breakdown voltage following quenching.

The array 210 of photodetectors is split into subarrays 212 of photodetectors and therefore into subregions of detection (shown on FIG. 4). For example, the array 210 of photodetectors is split into four subarrays of 256 photodetectors. The subarrays 212 of photodetectors are coplanar. Here the array 210 of photodetectors has a square shape but it will be understood that it could have any shape. Likewise, each subarrays 212 has a square shape but it could have any shape.

The proximity sensor 202 comprises several spacers 214, 216, 218 and 220 (shown on FIG. 4). The spacer 214 is arranged on the substrate 204. The spacers 216, 218 and 220 are arranged on the die 208. One of the subarrays 212 of photodetectors is located between the spacers 216 and 218. Another one of the subarrays 212 is located between the spacers 218 and 220. The photoemitter 206 is located between the spacers 214 and 220. For example, the spacers 214, 216, 218 and 220 are made of structured silicon.

The proximity sensor 202 comprises an optic substrate 222 (shown on on FIG. 4). The optic substrate 222 is arranged on the spacers 214 and 220. The proximity sensor 202 also comprises an optic substrate 224 arranged on the spacers 216, 218 and 220. The optic substrates 222 and 224 are distant from one another on the spacer 220. The optic substrates 222 and 224 are transparent to infrared photons (e.g. transmittance equal to or a greater than 90%). For example, the optic substrates 222 and 224 are made of Borosilicate glass.

The proximity sensor 202 comprises a diverging optical element 226 (shown on FIG. 4). The diverging optical element 226 is arranged on the optic substrate 222. The diverging optical element 226 has an optical axis 228. The diverging optical element 226 is placed in the optical path of the photoemitter 206 and configured to direct the outgoing infrared photons 207 toward an object. For example, the diverging optical element 226 is made of an imprinted polymer. In some implementations, the diverging optical element 226 has a focal length comprised between 0.1 mm and 100 mm. In some implementations, the diverging optical element 226 has a divergence of 60 degrees.

The proximity sensor 202 comprises converging optical elements such as imaging lenses 230 (shown on FIG. 4). The converging optical elements 230 are arranged on the optic substrate 224. Each converging optical element 230 has an optical axis 232 and may be s arranged so that its optical axis 232 is parallel to the optical axis 228 of the diverging optical element 226. It will be understood that in some embodiments, some or all converging optical elements 230 may have their optical axes 232 not parallel to the optical axis 228 of the diverging optical elements 226. That is, some or all optical channels may look in different directions.

Each converging optical element 230 is placed in the optical path of a respective subarray 212 of photodetectors. Each converging optical element 230 is configured to direct the incoming infrared photons 213 reflected by an object toward its respective subarray 212 of photodetectors. For example, each converging optical element 230 is made of an injection moulded polymer. For example, each converging optical element has a focal length comprised between 0.5 and 10 mm.

In an implementation, the proximity sensor 202 comprises filters (not shown) to filter (i.e. block) wavelengths outside of the sensor operating bandwidth. The filters may be part of the converging optical elements 230 or separate from the converging optical elements 230. For example, the filters may be a coating applied on the converging optical elements 230.

The proximity sensor 202 comprises a package 234 comprising a front face and lateral faces connected to the front face. The lateral faces rest on the substrate 204 and extend substantially perpendicular to the substrate 204. The front face rest on the optic substrate 222 and 224 and extends substantially parallel to the substrate 204. Here, the package 234 has the shape of a rectangular prism but it will be understood that it could be of any shape. In an implementation, the package 234 is made of injection moulded polymer.

The package 234 comprises an aperture 236 within the front face. The aperture 236 is arranged in the optical path of the diverging optical element 226 and the photoemitter 206 to allow outgoing infrared photons 207 through. In an implementation, the aperture 236, the diverging optical element 226 and the photoemitter 206 are aligned along the optical axis 228 of the diverging optical element 226. Here, the aperture 236 has a circular shape but it will be understood that it could have any shape.

The package 234 also comprises apertures 238 within the front face. Each aperture 238 is arranged in the optical path of a respective converging optical element 230 and a respective subarray 212 of photodetectors to allow incoming infrared photons 213 through. In an implementation, each aperture 238, respective converging optical element 230 and respective subarray 212 of photodetectors are aligned along the optical axis 232 of the converging optical element 230. Here, each aperture 230 has a circular shape but it will be understood that it could have any shape. In an implementation, each aperture 230 has the same diameter as its respective converging optical element 230.

It will be understood that, although in the above embodiments the proximity sensor 202 is integrated in a single packaged module, the proximity sensor 202 could be integrated in separate chips. For example, the photoemitter 206 and associated components could be integrated in a packaged module and the array 210 of photodetectors and associated components could be integrated in a second packaged module.

In operation, outgoing infrared photons 207 generated by the photoemitter 206 are directed toward an object by the diverging lens 226. Some of the outgoing infrared photons 207 are reflected by the object and directed back toward the subarrays 212 of photodetectors by the converging optical elements 230. Incoming infrared photons 213 are then detected by each photodetector of each subarray 212 of photodetectors. In this way, a time of flight and a distance may be determined by each photodetector of each subarray 212 of photodetectors. The presence of an object may be detected, an average distance to an object may be measured, or a depth map of an object may be determined for example.

An advantage of the proximity sensor 202 over conventional proximity sensors is that it provides both high performance and thin form factor. Indeed, the proximity sensor 202 uses a plurality of small converging optical elements 230 as opposed to a single large converging optical element 8 (shown on FIG. 5) to direct a large amount of infrared photons toward the array 210 of photodetectors. In this way, high performance may be achieved. In particular, the signal to noise ratio may be improved by square root of N (i.e. sqrt (N)), where N designates the number of subarrays of photodetectors or channels.

Moreover, each small converging lens 230 may have a smaller focal length F than the single large converging optical element 8. Accordingly, the distance D between each converging lens 230 and the respective subarray 212 of photodetectors may be reduced and a thin form factor may be achieved.

Figure 6:
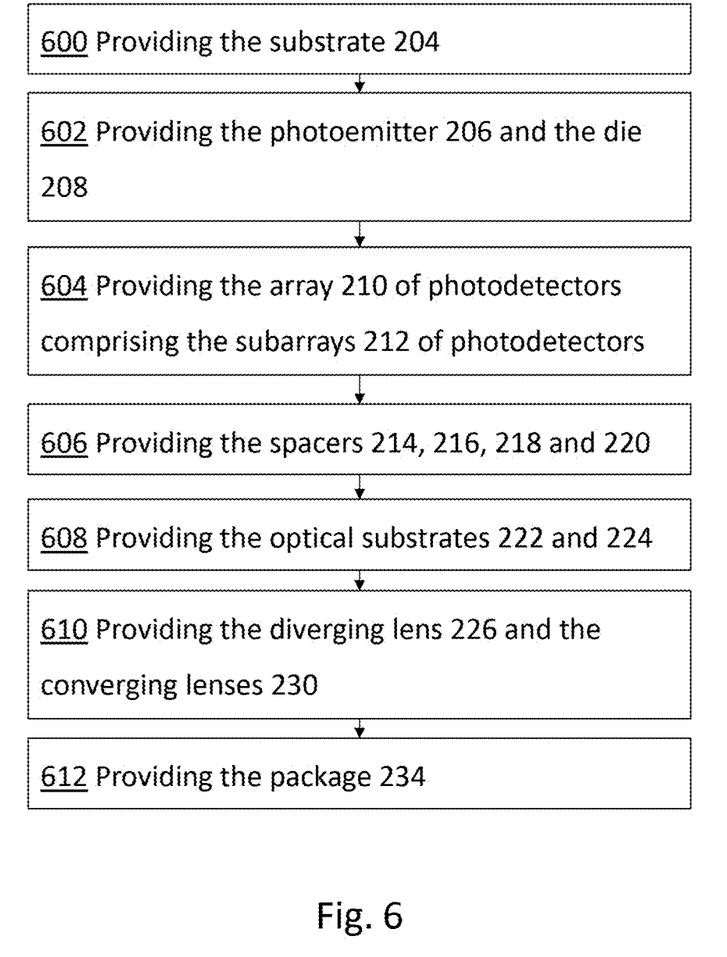
FIG. 6 shows a flow diagram of an example of a method of manufacturing a sensor according to an embodiment disclosed herein.

FIG. 6 shows a flow diagram of an example of a method of manufacturing the proximity sensor 202 according to an embodiment.

In step 600, the substrate 204 is provided.

In step 602, the photoemitter 206 and the die 208 are provided and arranged on the substrate 204.

In step 604, the array 210 of photodetectors comprising the subarrays 212 of photodetectors is provided and arranged on the die 208.

In step 606, the spacer 214 is provided and arranged on the substrate 204. Moreover, the spacers 216, 218 and 218 are provided and arranged on the die 208.

In step 608, the optical substrate 222 is provided and arranged on the spacers 214 and 220. Moreover, the optical substrate 224 is provided and arranged on the spacers 216, 218 and 220.

In step 610, the diverging optical element 226 is provided and arranged on the optical substrate 222. Moreover, the converging optical element 230 are provided and arranged on the optical substrate 224.

In step 612, the package 234 is provided and arranged on the substrate 204.

The steps 600 to 612 may be performed using conventional techniques and therefore not described in further detail.

Figure 7:
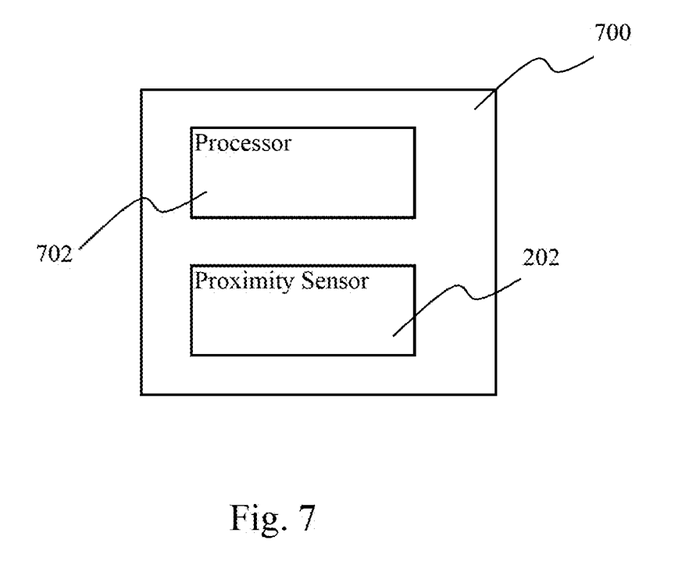
FIG. 7 is a block diagram of an apparatus that includes a proximity sensor.

Shown in FIG. 7 is a block diagram of an apparatus 700 that includes the proximity sensor 202 and a processor 702. The processor 702 may be a microprocessor, microcontroller, image processor, or any other processing device capable of processing the image data produced by the proximity sensor. The apparatus 700 may be any device that would benefit from the sensor 202, such as a mobile phone, a tablet computer, a laptop computer, a desktop computer, a video game console, a smart card reader, a video camera, a television, a vehicle, etc.

Various embodiments with different variations have been described here above. It should be noted that those skilled in the art may combine various elements of these various embodiments and variations.

Such alterations, modifications, and improvements are intended to be part of this disclosure, and are intended to be within the scope of the claims. Accordingly, the foregoing description is by way of example only and is not intended to be limiting.

For example, it will be understood that although in the above embodiments the sensor is a proximity sensor, the sensor could be a different type of sensor such as an image sensor. It will be understood that in some embodiments some or all of the converging optical elements 230 may be omitted. It will be understood that the optical elements may be diffractive or refractive optical elements.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sensor comprising:
a die including:
a first subarray of a plurality of photodetectors; and
a second subarray of a plurality of photodetectors;
a substrate, the die being on the substrate;
a first spacer on the die;
a second spacer on the die, the first subarray being positioned between the first spacer and the second spacer;
a third spacer on the die, the second subarray being positioned between the second spacer and the third spacer;
a fourth spacer on the substrate, the fourth spacer offset from the die on the substrate, the fourth spacer being closer to the first spacer than to the third spacer;
a first optical arrangement aligned with the first subarray, the first spacer being between the first optical arrangement and the die;
a second optical arrangement aligned with the second subarray, the second spacer being between the first optical arrangement and the die, the second spacer being between the second optical arrangement and the die, the first and second optical arrangement include:
a first optical substrate on the first, second, and third spacer;
a third optical arrangement having:
a second optical substrate on the first and the fourth spacer; and
a photoemitter on the substrate.

2. The sensor according to claim 1, further comprising a package with a front face, wherein the first optical arrangement includes a first aperture within the front face and the second optical arrangement includes a second aperture within the front face.

3. The sensor according to claim 1, wherein the first optical arrangement includes a first converging optical element and the second optical arrangement includes a second converging optical element.

4. The sensor according to claim 3, wherein the first subarray and the first converging optical element are aligned along an optical axis of the first converging optical element and wherein the second subarray and the second converging optical element are aligned along an optical axis of the second converging optical element.

5. The sensor according to claim 4, wherein the optical axis of the first converging optical element is parallel to the optical axis of the second converging optical element.

6. The sensor according to claim 5, wherein the first subarray and the second subarray are coplanar.

7. The sensor according to claim 6, wherein the first subarray and the second subarray are arranged on a same substrate.

8. The sensor according to claim 3, wherein:
the first converging optical arrangement includes a first aperture;
the second converging optical arrangement includes a second aperture;
the first subarray, the first converging optical element and the first aperture are aligned along an optical axis of the first converging optical element; and
the second subarray, the second converging optical element and the second aperture are aligned along an optical axis of the second converging optical element.

9. The sensor according to claim 1, further comprising:
the third optical arrangement including a diverging optical element;
wherein the third optical arrangement is aligned with the photoemitter.

10. The sensor according to claim 9, wherein:
the first optical arrangement includes a first converging optical element and the second optical arrangement includes a second converging optical element; and
an optical axis of the diverging optical element is parallel to an optical axis of the first converging optical element and an optical axis of the second converging optical element.

11. The sensor according to claim 9, further comprising:
a package including a front face;
wherein the first optical arrangement includes a first aperture within the front face, the second optical arrangement includes a second aperture within the front face,
and the third optical arrangement includes a third aperture within the front face.

12. The sensor according to claim 11, wherein the third aperture, the diverging optical element and the photoemitter are aligned along an optical axis of the diverging optical element.

13. The sensor according to claim 1, wherein the sensor is a proximity sensor.

14. The sensor according to claim 1, wherein each of the photodetectors of the first and second subarrays comprises a single photon avalanche diode.

15. An apparatus comprising:
a substrate;
a sensor coupled to the substrate and including:
a die including:
a first subarray of a plurality of photodetectors at a first surface; and
a second subarray of a plurality of photodetectors at the first surface;
a first spacer on the first surface of the die;
a second spacer on the first surface of the die, the first subarray being between the first spacer and the second spacer;

a third spacer on the first surface of the die, the second subarray being between the second spacer and the third spacer;

a first optical arrangement aligned with the first subarray, the first spacer being between the first optical arrangement and the die; and a second optical arrangement aligned with the second subarray, the second spacer being between the first optical arrangement and the die, the second spacer being between the second optical arrangement and the die;

a fourth spacer on the substrate;

a light emitting element on the substrate and spaced from the die, the light emitting element being between the fourth spacer and the third spacer;

a first optical substrate on the first, second, and third spacers; and a second optical substrate on the third and fourth spacers.

16. The apparatus according to claim 15, wherein the apparatus comprises a mobile phone, a tablet computer, a laptop computer, a video game console, a smart card reader, a video camera, a television or a vehicle.

17. A method, comprising:
manufacturing a sensor by:
positioning a die on a support, the die having a first subarray of a plurality of photodetectors and a second subarray of a plurality of photodetectors;
forming a first spacer on the die, the first spacer being between the first su barray and the second subarray;
forming a second spacer on the die;
forming a third spacer on the die;
forming a fourth spacer on the support;
positioning a first optical element on the first, second, and third spacer;
positioning a first optical arrangement aligned with the first subarray, the first optical arrangement including a first portion of the first optical element;
positioning a second optical arrangement aligned with the second subarray, the second optical arrangement including a second portion of the first optical element, the first optical arrangement being separated from the die with the first spacer and the second optical arrangement being separated from the die with the second spacer;
positioning a fourth optical element on the third and fourth spacer; and
positioning a light emitting device on the support between the third spacer and the fourth spacer.

18. The method of claim 17, further comprising:
providing a package with a front face, wherein:
the first optical arrangement comprises a first aperture within the front face and a first converging optical element;
the second optical arrangement comprises a second aperture within the front face and a second converging optical element;
the first subarray, first aperture, first converging optical element are aligned along an optical axis of the first converging optical element; and
the second subarray, second aperture, and second converging optical element are aligned along an optical axis of the second converging optical element.

19. The method of claim 18, further comprising:
positioning a third optical arrangement aligned with the light emitting device, the third optical arrangement separated from the substrate by the third spacer and the fourth spacer.

* * * * *

UNITED STATES PATENT AND TRADEMARK OFFICE
CERTIFICATE OF CORRECTION

PATENT NO. : 10,756,228 B2  Page 1 of 1
APPLICATION NO. : 15/967242
DATED : August 25, 2020
INVENTOR(S) : James Peter Drummond Downing It is certified that error appears in the above-identified patent and that said Letters Patent is hereby corrected as shown below:

In the Claims

Column 9, Line 30, Claim 17:
"su barray" should read, --subarray--.

Signed and Sealed this
Twenty-seventh Day of October, 2020

Andrei Iancu
*Director of the United States Patent and Trademark Office*